United States Patent
Gilchrist et al.

(10) Patent No.: US 10,141,161 B2
(45) Date of Patent: *Nov. 27, 2018

(54) ANGLE CONTROL FOR RADICALS AND REACTIVE NEUTRAL ION BEAMS

(71) Applicant: Varian Semiconductor Equipment Associates, Inc., Gloucester, MA (US)

(72) Inventors: Glen FR Gilchrist, Danvers, MA (US); Shurong Liang, Lynnfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 13 days.

This patent is subject to a terminal disclaimer.

(21) Appl. No.: 15/262,471

(22) Filed: Sep. 12, 2016

(65) Prior Publication Data

US 2018/0076007 A1    Mar. 15, 2018

(51) Int. Cl.
*H01J 37/30* (2006.01)
*H01J 37/32* (2006.01)

(52) U.S. Cl.
CPC .... *H01J 37/3007* (2013.01); *H01J 37/32422* (2013.01); *H01J 2237/3341* (2013.01)

(58) Field of Classification Search
CPC ........ H01L 21/3065; H01J 2237/30472; H01J 2237/3343; H01J 37/3244;

(Continued)

(56) References Cited

U.S. PATENT DOCUMENTS

| 4,714,834 A | 12/1987 | Shubaly |
| 6,909,086 B2 * | 6/2005 | Samukawa .............. H05H 3/02 250/251 |

(Continued)

FOREIGN PATENT DOCUMENTS

| JP | 2014-522104 A | 8/2014 |
| KR | 1020000044933 A | 7/2000 |
| KR | 1020110098355 A | 9/2011 |

OTHER PUBLICATIONS

Jay Wallace, et al., Gas Injection System for Ion Beam Device, filed as U.S. Appl. No. 14/840,531, filed Aug. 31, 2015.

(Continued)

*Primary Examiner* — Wyatt Stoffa
(74) *Attorney, Agent, or Firm* — Nields, Lemack & Frame, LLC

(57) ABSTRACT

A workpiece processing apparatus allowing independent control of the extraction angles of charged ions and reactive neutrals is disclosed. The apparatus includes an extraction plate having an extraction aperture through which charged ions pass. Plasma sheath modulation and electric fields may be used to determine the extraction angle of the charged ions. The extraction plate also includes one or more neutral species channels, separate from the extraction aperture, through which reactive neutrals are passed at a selected extraction angle. The geometric configuration of the neutral species channels determines the extraction angle of the reactive neutrals. The neutral species channel may also comprise a suppressor, to reduce the number of charged ions that pass through the neutral species channel. The apparatus may be used for various applications, such as directed reactive ion etching.

19 Claims, 10 Drawing Sheets

(58) Field of Classification Search
CPC ....... H01J 2237/31744; H01J 2237/327; H01J 2237/32009; H01J 2237/32357; H01J 37/1371; H01J 37/32834; H05H 1/24
See application file for complete search history.

(56) References Cited

U.S. PATENT DOCUMENTS

| | | | |
|---|---|---|---|
| 7,183,219 | B1 | 2/2007 | Hama et al. |
| 8,147,648 | B2 | 4/2012 | Dhindsa |
| 8,497,486 | B1 | 7/2013 | Blahnik et al. |
| 8,779,400 | B2 | 7/2014 | Shichi et al. |
| 9,017,526 | B2 | 4/2015 | Singh et al. |
| 9,288,889 | B2* | 3/2016 | Radovanov ....... H01J 37/32357 |
| 9,449,793 | B2* | 9/2016 | Shajii ..................... H01J 37/321 |
| 9,706,634 | B2* | 7/2017 | Liang ........................ H05H 1/24 |
| 2001/0055649 | A1* | 12/2001 | Ogure ..................... C23C 16/18 427/248.1 |
| 2002/0151182 | A1 | 10/2002 | Scott |
| 2006/0045987 | A1* | 3/2006 | Chandler ............ B81C 1/00531 427/569 |
| 2006/0060566 | A1 | 3/2006 | Puech |
| 2007/0273289 | A1 | 11/2007 | Burtner et al. |
| 2008/0164819 | A1 | 7/2008 | Hwang et al. |
| 2010/0084582 | A1 | 4/2010 | Lischer et al. |
| 2010/0255665 | A1 | 10/2010 | Godet et al. |
| 2010/0330787 | A1 | 12/2010 | Sferlazzo |
| 2011/0108058 | A1 | 5/2011 | Srivastava et al. |
| 2011/0139748 | A1 | 6/2011 | Donnelly et al. |
| 2012/0138472 | A1 | 6/2012 | Han et al. |
| 2012/0175062 | A1 | 7/2012 | de la Llera et al. |
| 2013/0250293 | A1 | 9/2013 | Utlaut et al. |
| 2014/0014497 | A1* | 1/2014 | Druz ..................... C23C 14/081 204/192.11 |
| 2014/0034611 | A1* | 2/2014 | Godet ................... C23C 16/045 216/67 |
| 2014/0038393 | A1* | 2/2014 | Godet ............... H01J 37/32366 438/478 |
| 2014/0272179 | A1* | 9/2014 | Radovanov ....... H01J 37/32357 427/523 |
| 2014/0326897 | A1 | 11/2014 | Kawanami et al. |
| 2015/0044840 | A1 | 2/2015 | Kobayashi et al. |
| 2015/0083581 | A1* | 3/2015 | Sherman ............. H01L 21/3065 204/192.34 |
| 2015/0083582 | A1* | 3/2015 | Dhindsa .............. H01L 21/3065 204/192.37 |
| 2015/0099369 | A1 | 4/2015 | Deshmukh et al. |
| 2015/0132961 | A1 | 5/2015 | Chang et al. |
| 2015/0155178 | A1* | 6/2015 | Kim .................... H01L 21/6719 438/710 |
| 2015/0179409 | A1* | 6/2015 | Biloiu ............... H01J 37/32357 216/66 |
| 2015/0197853 | A1 | 7/2015 | Ishibashi et al. |
| 2015/0325411 | A1* | 11/2015 | Godet ............... H01J 37/32899 216/59 |
| 2016/0013020 | A1* | 1/2016 | Ashtiani ............. C23C 16/452 216/67 |
| 2016/0049281 | A1* | 2/2016 | Berry, III ................ H01J 37/36 156/345.26 |
| 2016/0240389 | A1 | 8/2016 | Zhang et al. |
| 2016/0300696 | A1* | 10/2016 | Jiang ................. H01J 37/32357 |
| 2017/0025252 | A1* | 1/2017 | Liang .................. H01J 37/3053 |
| 2017/0042010 | A1* | 2/2017 | Liang ...................... H05H 1/24 |
| 2017/0062185 | A1 | 3/2017 | Wallace et al. |
| 2017/0135194 | A1 | 5/2017 | Belchenko et al. |
| 2017/0213747 | A9* | 7/2017 | Dhindsa ............. H01L 21/3065 |

OTHER PUBLICATIONS

Shurong Liang, et al., Apparatus and Techniques to Treat Substrates Using Directional Plasma and Point of Use Chemistry, filed as U.S. Appl. No. 14/808,612, filed Jul. 24, 2015.
Shurong Liang, et al., Apparatus and Techniques to Treat Substrates Using Directional Plasma and Reactive Gas, filed as U.S. Appl. No. 14/970,738, filed Dec. 16, 2015.
International Search Report and Written Opinion dated Nov. 22, 2017 in corresponding PCT application No. PCT/US2017/046207.
International Search Report and Written Opinion dated Nov. 14, 2016 in co-pending PCT application No. PCT/US2016/047236.
International Search Report and Written Opinion dated Oct. 19, 2016 in co-pending PCT application No. PCT/US2016/042261.
International Search Report and Written Opinion dated Oct. 19, 2016 in co-pending PCT application No. PCT/US2016/042497.
Xun Gu, et al., A Novel Metallic Complex Reaction Etching for Transition Metal and Magnetic Material by Low Temperature and Damage-free Neutral Beam Process for Non-volatile MRAM Device Applications, 2014 Symposium on VLSI Technology Digest of Technical Papers, IEEE.
Office action dated Apr. 11, 2017 in co-pending U.S. Appl. No. 14/840,531.
Office action dated Aug. 30, 2017 in co-pending U.S. Appl. No. 14/840,531.
Final rejection dated Jan. 16, 2018 in co-pending U.S. Appl. No. 14/840,531.
Office action dated Jul. 20, 2017 in co-pending U.S. Appl. No. 14/808,612.
Office action dated Nov. 20, 2017 in co-pending U.S. Appl. No. 14/808,612.

* cited by examiner

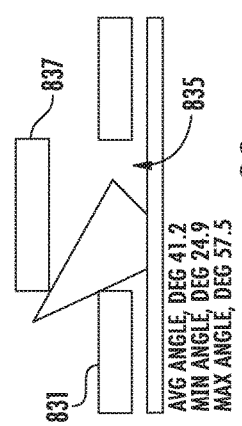
FIG. 8A
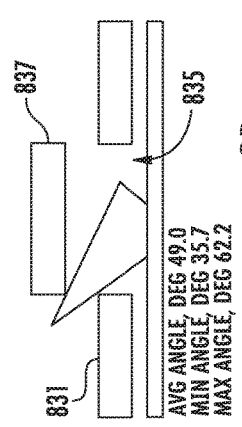
FIG. 8B
FIG. 8C
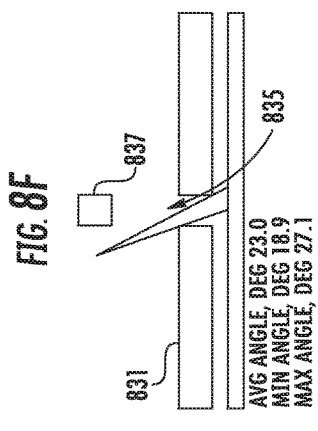
FIG. 8D
FIG. 8E
FIG. 8F
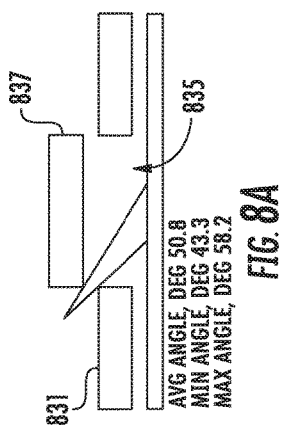
FIG. 8G
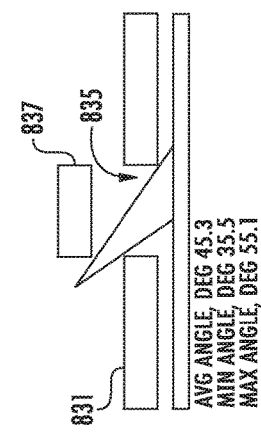
FIG. 8H
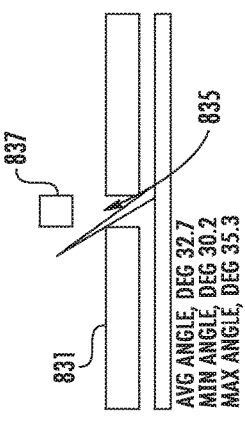
FIG. 8I

US 10,141,161 B2

ANGLE CONTROL FOR RADICALS AND REACTIVE NEUTRAL ION BEAMS

FIELD

Embodiments of the present disclosure relate to angle control for neutral ion beams, and more particularly, an apparatus for creating charged ion beams and neutral beams for use in directed reactive ion etch processes.

BACKGROUND

Fabrication of advanced three dimensional semiconductor structures with complex surface topology and high packing density presents many technical challenges. As the critical dimension of devices and the pitch decreases, the aspect ratio of features increases. For example, this trend results in deep, but very narrow trenches on the surface of the workpiece. These trenches may be created using a technique known as reactive ion etch, or RIE. Trimming and forming the various trench liner materials may be performed using a technique known as directed reactive ion etching, DRIE. Precise angle control is used to selectively etch a specified portion of the walls of these trenches. Angular control of an ion beam may be obtained through the manipulation of electrical fields, which serve to focus the ions in a particular direction.

The etch rates of reactive ion etching may be enhanced by supplementing the charged ion beam with reactive neutrals. However, reactive neutrals are not controllable using electrical fields. Therefore, while the angle of the charged ion beam may be precisely controlled, the same is not true for reactive neutrals. As the angles used for DRIE decrease (i.e. become closer to perpendicular to the workpiece), the lack of angular control of the reactive neutrals becomes more pronounced. Reactive neutrals are defined as those radicals/atoms which are highly reactive with some of the materials on the workpiece, but not others. For example, under the correct process conditions, chlorine has a high reaction rate with TiN, but a very low reaction rate with $SiO_2$. These reactive neutrals serve to etch portions of the workpiece, without affecting other parts. The inability to control the angle at which the reactive neutrals are directed toward the workpiece may compromise the speed of the etching process. In certain embodiments, the inability to control the angle at which the reactive neutrals are directed toward the workpiece may make it difficult to achieve the specified feature on the workpiece.

Thus, it would be beneficial if there was an apparatus which could control the angle at which reactive neutrals are directed toward a workpiece. Further, it would beneficial if the apparatus also controls the angle at which charged ions are directed toward the workpiece. Such an apparatus may be beneficial in certain applications, such as directed reactive ion etching.

SUMMARY

A workpiece processing apparatus allowing independent control of the extraction angles of charged ions and reactive neutrals is disclosed. The apparatus includes an extraction plate having an extraction aperture through which charged ions pass. Plasma sheath modulation and electric fields may be used to determine the extraction angle of the charged ions. In certain embodiments, the extraction plate also includes one or more neutral species channels, separate from the extraction aperture, through which reactive neutrals are passed at a selected extraction angle. The geometric configuration of the neutral species channels determines the extraction angle of the reactive neutrals. The neutral species channel may also comprise a suppressor, to reduce the number of charged ions that pass through the neutral species channel. The apparatus may be used for various applications, such as directed reactive ion etching.

According to one embodiment, a workpiece processing apparatus is disclosed. The workpiece processing apparatus comprises a plasma generator; a plasma chamber; and an extraction plate having a first aperture and a second aperture; wherein charged ions are extracted through the first aperture at a first selected extraction angle, and reactive neutrals are passed through the second aperture at a second selected extraction angle, where the second aperture is different than the first aperture. In certain embodiments, the second aperture comprises a suppressor to minimize charged ions passing through the second aperture. The suppressor may be an electrically biased grid, an electrically biased cup, or a sieve. In certain embodiments, the second selected extraction angle is determined by a tilt of the second aperture relative to a plane orthogonal to the extraction plate. In certain embodiments, the angular distribution of reactive neutrals about the second selected extraction angle is determined by an aspect ratio of the second aperture, defined as a length of the second aperture through the extraction plate divided by a height of the second aperture. In certain embodiments, a blocker is disposed in the plasma chamber. In certain embodiments, the reactive neutrals are created in a remote neutral species generator, different from the plasma chamber, and are transported to the second aperture.

According to another embodiment, a workpiece processing apparatus is disclosed. The workpiece processing apparatus comprises a plasma generator; a plasma chamber; and an extraction plate, through which charged ions and reactive neutrals are extracted, wherein the workpiece processing apparatus uses a first mechanism to extract charged ions from the plasma chamber through an extraction aperture disposed in the extraction plate at a first selected extraction angle and uses a second mechanism to extract reactive neutrals from the plasma chamber at a second selected extraction angle. In certain embodiments, the first mechanism comprises plasma sheath modulation or electric fields proximate the extraction aperture. In certain embodiments, the second mechanism comprises geometric configuration of a neutral species channel. In certain embodiments, the neutral species channel is disposed in the extraction plate. In certain embodiments, the neutral species channel is disposed in a blocker disposed within the plasma chamber proximate the extraction aperture.

According to another embodiment, a workpiece processing apparatus is disclosed. The workpiece processing apparatus comprises a plasma generator; a plasma chamber; and an extraction plate comprising an extraction aperture; wherein the workpiece processing apparatus uses plasma sheath modulation or electric fields to extract charged ions through the extraction aperture as an ion beam at a first selected extraction angle; and wherein reactive neutrals are passed through a neutral species channel at a second selected extraction angle. The neutral species channel may be disposed in the extraction plate, or may be disposed in a blocker disposed within the plasma chamber proximate the extraction aperture. In certain embodiments, the neutral species channel is the extraction aperture.

BRIEF DESCRIPTION OF THE FIGURES

For a better understanding of the present disclosure, reference is made to the accompanying drawings, which are incorporated herein by reference and in which:

FIGS. 8A-8I show various configurations of a blocker and an extraction aperture and the resulting extraction angles;

DETAILED DESCRIPTION

Figure 1:
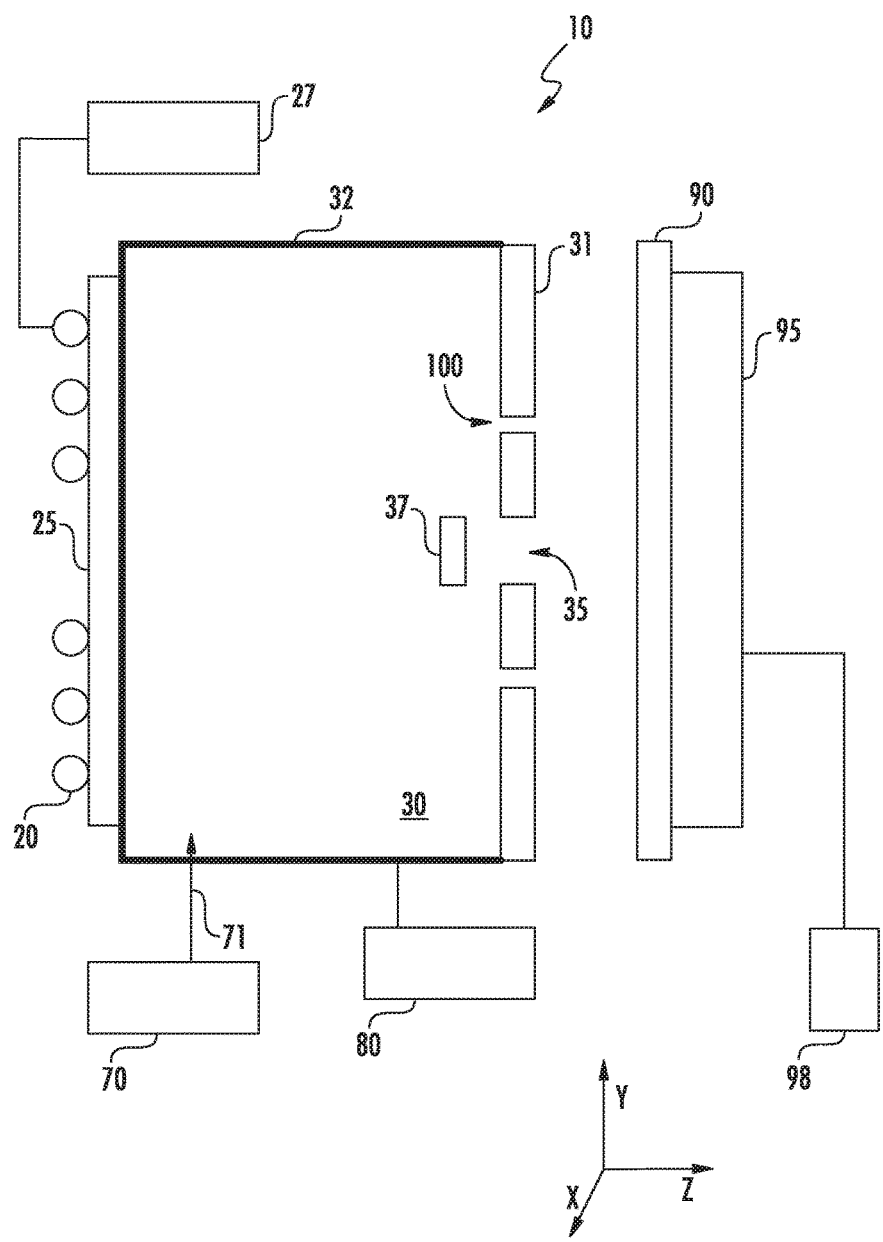
FIG. 1 is a workpiece processing apparatus in accordance with one embodiment.

FIG. 1 shows a first embodiment of workpiece processing apparatus 10 for controlling the angle at which charged ions and reactive neutrals are directed toward a workpiece 90. The workpiece processing apparatus 10 comprises a plasma chamber 30, which is defined by a plurality of chamber walls 32.

An antenna 20 is disposed external to a plasma chamber 30, proximate a dielectric window 25. The dielectric window 25 may also form one of the walls that define the plasma chamber 30. The antenna 20 is electrically connected to a RF power supply 27, which supplies an alternating voltage to the antenna 20. The voltage may be at a frequency of, for example, 2 MHz or more. While the dielectric window 25 and antenna 20 are shown on one side of the plasma chamber 30, other embodiments are also possible. For example, the antenna 20 may surround the chamber walls 32 or be disposed on the top of the plasma chamber 30. The chamber walls 32 of the plasma chamber 30 may be made of a conductive material, such as graphite. These chamber walls 32 may be biased at an extraction voltage, such as by extraction power supply 80. The extraction voltage may be, for example, 1 kV, although other voltages are within the scope of the disclosure.

The workpiece processing apparatus 10 includes an extraction plate 31 having an extraction aperture 35. The extraction plate 31 may form another wall that defines plasma chamber 30. The extraction aperture 35 may be about 320 mm in the x-direction and 30 mm in the y-direction, although other dimensions are possible. The extraction plate 31 may have a thickness in the z-direction of between 5 and 10 mm, although other dimensions are also possible. This extraction plate 31 may be disposed on the side of the plasma chamber 30 opposite the dielectric window 25, although other configurations are also possible. In certain embodiments, the extraction plate 31 may be constructed from an insulating material. For example, the extraction plate 31 may comprise quartz, sapphire, alumina or a similar insulating material. The use of an insulating material may allow modulation of the plasma sheath, which affects the angle at which charged ions exit the extraction aperture 35. In other embodiments, the extraction plate 31 may be constructed of a conducting material.

A blocker 37 may be disposed proximate the extraction aperture 35 on the interior of the plasma chamber 30. In certain embodiments, the blocker 37 is constructed from an insulating material. The blocker 37 may be about 3-5 mm in the z-direction, and the same dimension as the extraction aperture 35 in the x-direction. The length of the blocker 37 in the y-dimension may be varied to achieve the target extraction angles.

The position and size of the blocker 37 along with the size and shape of the edges of the extraction aperture 35 may define the boundary of the plasma sheath within the plasma chamber 30. The boundary of the plasma sheath, in turn, determines the angle at which charged ions cross the plasma sheath and exit through the extraction aperture 35. In certain embodiments, the blocker 37 may include a conductive material. In these embodiments, the conductive material on the blocker 37 may be biased so as to create an electric field proximate the extraction aperture 35. The electric field may also serve to control the angle at which the charged ions exit through the extraction aperture 35. A blocker 37 positioned between the interior of the plasma chamber 30 and the extraction aperture 35, such as is shown in FIG. 1, may create a bimodal extraction angle profile. In other words, charged ions may exit the extraction aperture 35 at either +θ° or −θ°, where θ is determined by the size and position of the blocker 37, the width of extraction aperture 35 and the electric fields proximate the extraction aperture.

While FIG. 1 shows a blocker 37, in other embodiments, a blocker 37 is not employed.

A workpiece 90 is disposed proximate and outside the extraction plate 31 of the plasma chamber 30. In some embodiments, the workpiece 90 may be within about 1 cm of the extraction plate 31 in the z-direction, although other distances are also possible. In operation, the antenna 20 is powered using a RF signal from the RF power supply 27 so as to inductively couple energy into the plasma chamber 30. This inductively coupled energy excites the feed gas introduced from a gas storage container 70 via gas inlet 71, thus generating a plasma. While FIG. 1 shows an antenna, other plasma generators may also be used with the present disclosure. For example, a capacitively coupled plasma generator may be used.

The plasma within the plasma chamber 30 may be biased at the voltage being applied to the chamber walls 32 by the extraction power supply 80. The workpiece 90, which may be disposed on a platen 95, is disposed proximate the extraction plate 31. The platen 95 may be electrically biased by a bias power supply 98. The difference in potential between the plasma and the workpiece 90 causes charged ions in the plasma to be accelerated through the extraction aperture 35 in the form of one or more ribbon ion beams and toward the workpiece 90. In other words, positive ions are attracted toward the workpiece 90 when the voltage applied by the extraction power supply 80 is more positive than the bias voltage applied by the bias power supply 98. Thus, to extract positive ions, the chamber walls 32 may be biased at a positive voltage, while the workpiece 90 is biased at a less positive voltage, ground or a negative voltage. In other embodiments, the chamber walls 32 may be grounded, while the workpiece 90 is biased at a negative voltage. In yet other embodiments, the chamber walls 32 may be biased at a negative voltage, while the workpiece 90 is biased at a more negative voltage.

The ribbon ion beams 60 (see FIG. 2) may be at least as wide as the workpiece 90 in one direction, such as the x-direction, and may be much narrower than the workpiece 90 in the orthogonal direction (or y-direction). In one embodiment, the extracted ribbon ion beam 60 may be about 1 mm in the y-direction and 320 mm in the x-direction.

Further, the platen 95 and workpiece 90 may be translated relative to the extraction aperture 35 such that different portions of the workpiece 90 are exposed to the ribbon ion beam 60. The process wherein the workpiece 90 is translated so that the workpiece 90 is exposed to the ribbon ion beam 60 is referred to as "a pass". A pass may be performed by translating the platen 95 and workpiece 90 while maintaining the position of the plasma chamber 30. The speed at which the workpiece 90 is translated relative to the extraction aperture 35 may be referred to as workpiece scan velocity. In certain embodiments, the workpiece scan velocity may be about 100 mm/sec, although other speeds may be used. In another embodiment, the plasma chamber 30 may be translated while the workpiece 90 remains stationary. In other embodiments, both the plasma chamber 30 and the workpiece 90 may be translated. In some embodiments, the workpiece 90 moves at a constant workpiece scan velocity relative to the extraction aperture 35 in the y-direction, so that the entirety of the workpiece 90 is exposed to the ribbon ion beam 60 for the same amount of time.

As described above, the extraction aperture 35 is used to direct the charged ions toward the workpiece 90 at a predetermined angle. As described above, plasma sheath modulation and electric fields are used to control the angle at which the charged ions exit the extraction aperture 35. However, reactive neutrals are not affected by either of these mechanisms and therefore leave the extraction aperture in a random manner. The reactive neutrals travel in straight lines until they collide with other particles or structures. For example, the reactive neutrals may collide with the blocker 37, the extraction plate 31, or with other ions or reactive neutrals. Collisions between reactive neutrals including radicals and atoms may result in recombination to form molecules which are typically much less reactive and of no practical use in the DRIE process. As a result, most reactive neutrals exit the extraction aperture at high extraction angles. Throughout this disclosure, extraction angles are referenced to the plane perpendicular to the workpiece 90. Thus, an extraction angle of 0° refers to a path that is perpendicular to the surface of the workpiece 90, while an extraction angle of 90° is a path parallel to the surface of the workpiece 90.

The extraction angle of the reactive neutrals may be somewhat controlled by the placement and size of the blocker 37, however, the range and precision of this angular control is limited.

Thus, to better control the extraction angle of the reactive neutrals, one or more neutral species channels 100 may be disposed in the extraction plate 31.

The neutral species channels 100 may be disposed in the extraction plate 31, on opposite sides of the extraction aperture 35. In this way, there are at least two neutral species channels 100 which may be disposed to direct the reactive neutrals toward the workpiece 90 at two angles, which may correspond to the bimodal distribution of the charged ions exiting the extraction aperture 35. Of course, in other embodiments, only one neutral species channel 100 may be disposed on the extraction plate 31.

Figure 2:
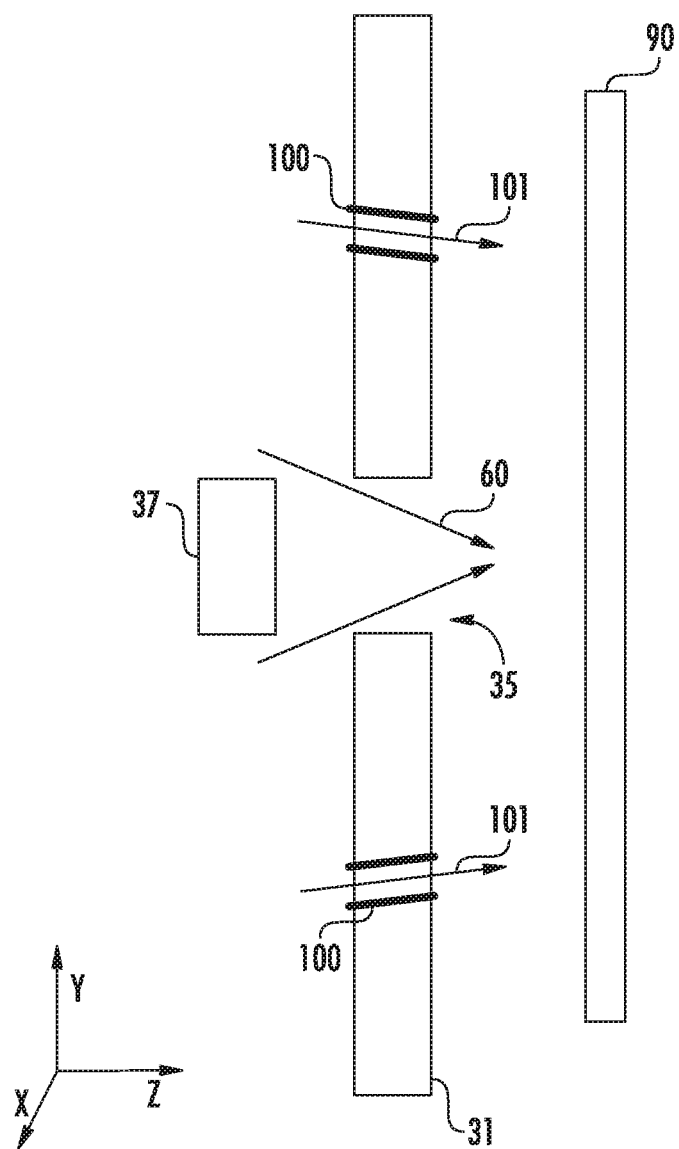
FIG. 2 is an expanded view of the extraction plate of the working processing apparatus of FIG. 1.

FIG. 2 shows an expanded view of the extraction plate 31, the blocker 37 and the workpiece 90 according to one embodiment. When a blocker 37 is employed, charged ions exit the extraction aperture 35 as two ribbon ion beams 60. The neutral species channels 100 facilitate the exit of reactive neutrals from the plasma chamber 30 as neutral beams 101. The reactive neutrals exiting the neutral species channels 100 have a range of extraction angles, defined by a central extraction angle and an angular distribution. A narrow distribution implies that most of the reactive neutrals are travelling in a path close to the central extraction angle.

The central extraction angle of the reactive neutrals is controlled by the direction of the neutral species channels 100. For example, FIG. 2 shows each of the neutral species channels 100 tilted slightly toward the extraction aperture 35. A horizontal neutral species channel may have a central extraction angle of 0°. The central extraction angle increases as the neutral species channel 100 is tilted away from the plane orthogonal to the extraction plate 31. The distribution of extraction angles of the reactive neutrals may be defined by the geometric configuration of the neutral species channels 100. The ratio of the dimension of the neutral species channel 100 in the z-direction to the dimension of the neutral species channel 100 in the y-direction may be referred to as the aspect ratio of the neutral species channel 100. A neutral species channel 100 with a high aspect ratio will have a narrower distribution of extraction angles than a neutral species channel with a lower aspect ratio. In certain embodiments, an aspect ratio of at least 5 may be desirable. In other embodiments, the aspect ratio may be greater than 10.

In certain embodiments, the neutral species channels 100 may be about 10 mm from the extraction aperture 35 in the y-direction. The neutral species channels 100 may have a dimension in the x-direction which is substantially equal to the dimension of the extraction aperture 35 in the x-direction.

In certain embodiments, it may be beneficial to allow only reactive neutrals to pass through the neutral species channels 100. This may be achieved by introducing a suppressor to the neutral species channel 100.

Figure 3C:
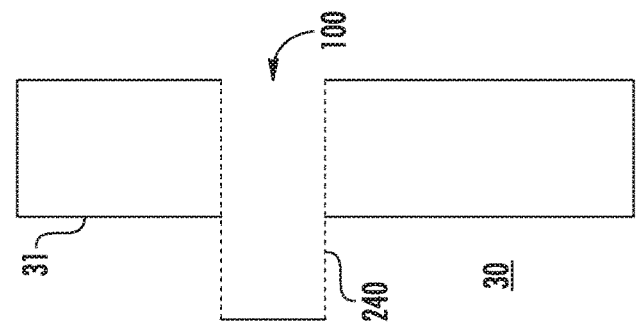
FIGS. 3A-3C shows three embodiments of a neutral species channel having a suppressor.
Figure 3B:
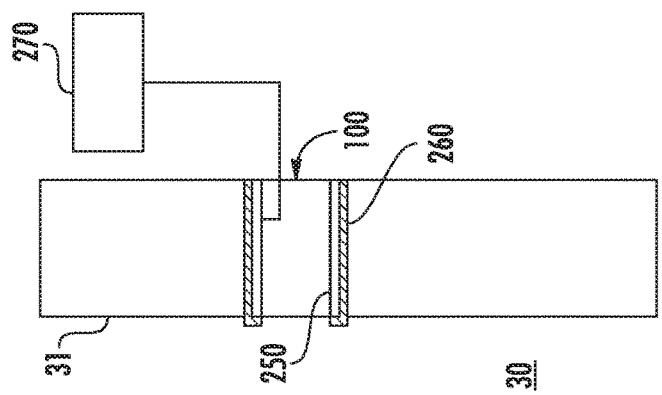
Figure 3A:
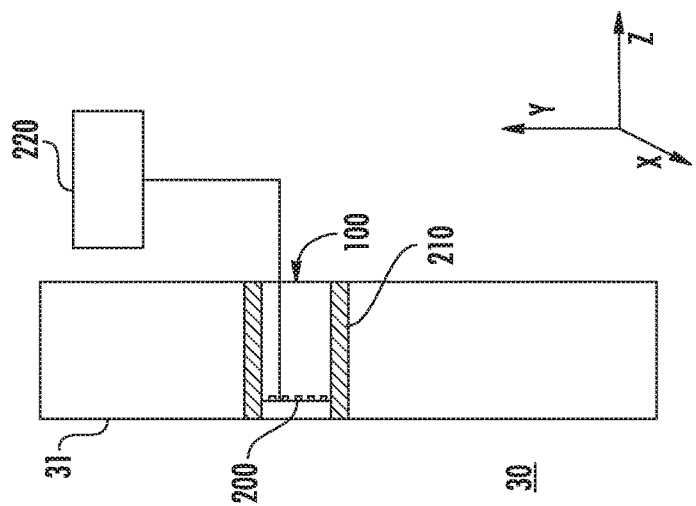

FIGS. 3A-3C shows different embodiments of a neutral species channel 100 that include a suppressor. The suppressor serves to suppress the passage of charged ions through the neutral species channel 100. In certain embodiments, this is achieved by repelling the charged ions away from the neutral species channel 100. In other embodiments, this is achieved by neutralizing any charged ions that enter the neutral species channel 100.

FIG. 3A shows an embodiment of the neutral species channel 100 which includes an electrically biased grid 200 disposed within an insulator 210. The insulator 210 may isolate the electrically biased grid 200 from the extraction plate 31. If the extraction plate 31 is made of an insulating material, the insulator 210 may not be employed. The electrically biased grid 200 may be constructed of a conductive material, such as a metal such as tungsten. The positive voltage may be applied by a grid power supply 220. The voltage may be selected to repel positive ions back toward an interior of the plasma chamber 30. The electrically biased grid 200 may be disposed anywhere in the neutral species channel 100. In certain embodiments, the electrically biased grid 200 may be disposed in the neutral species channel 100 near the interior of the plasma chamber 30 to minimize collisions within the neutral species channel 100. Other embodiments include baffles operated at a sufficient bias to repel charged ions back into the plasma chamber 30.

FIG. 3B shows an embodiment of the neutral species channel 100 which includes an electrically biased cup 250 disposed within an insulator 260. The insulator 260 may isolate the electrically biased cup 250 from the extraction plate 31. If the extraction plate 31 is made of an insulating material, the insulator 260 may not be employed. The electrically biased cup 250 may be constructed of a conductive material, such as a metal such as tungsten. The positive voltage may be applied by a cup power supply 270. The voltage may be selected to repel positive ions back toward an interior of the plasma chamber 30.

FIG. 3C shows an embodiment of the neutral species channel 100 that includes a sieve 240. In this embodiment, the sieve 240 admits charged ions and reactive neutrals from the plasma chamber 30 but causes ions to be neutralized by surface collisions before exiting the neutral species channel 100 toward the workpiece. Materials for the sieve 240 are selected such that reactive neutrals including radicals are not recombined on the walls of the sieve 240. The side of the sieve facing the plasma chamber 30 may be solid and the aspect ratio of the channel may be large enough such that ions do not have a line of sight path to the workpiece and collide with the top of the sieve or side walls of the neutral species channel 100 where they are neutralized.

The embodiments shown in FIGS. 3A-3C may be used with the extraction plate 31 shown in FIGS. 1 and 2. In other words, the extraction plate 31 may comprise an extraction aperture 35, through which charged ions are directed at a first selected extraction angle toward the workpiece 90. The extraction plate 31 may also include one or more neutral species channels 100, through which reactive neutrals are directed at a second selected extraction angle toward the workpiece 90. As described above, the first selected extraction angle may be determined by modulating the plasma sheath or through the use of electric fields. The second selected extraction angle may be determined by the geometric configuration of the neutral species channel 100. While the first selected extraction angle may be the same as the second selected extraction angle, it is noted that other embodiments exist. For example, the first and second selected angles may differ due to the forces of attraction on the charged ions that the reactive neutrals do not experience. By using different mechanisms to determine the first and second selected extraction angles, these extractions angle may be independently controlled.

It is noted that some reactive neutrals may also exit the plasma chamber 30 through the extraction aperture 35. However, the angle at which these reactive neutrals exit may not be controlled to the same level as the reactive neutrals exiting the neutral species channels 100. For example, the reactive neutrals that exit the extraction aperture 35 may have a wide distribution and may also have an extraction angle greater than the second selected extraction angle.

Thus, the present disclosure describes a workpiece processing apparatus that includes a plasma generator, a plasma chamber and an extraction plate, through which charged ions and reactive neutrals are extracted. The workpiece processing apparatus uses a first mechanism to extract charged ions from the plasma chamber at a first selected extraction angle and uses a second mechanism to extract reactive neutrals from the plasma chamber at a second selected extraction angle. As stated above, the first mechanism may be plasma sheath modulation or electric fields proximate the extraction aperture. The second mechanism may be the geometric configuration of the neutral species channels. Specifically, the orientation or tilt of the neutral species channels 100 may determine the central extraction angle, while the aspect ratio of the neutral species channel 100 may determine the distribution of the extraction angles.

Additionally, the present disclosure describes a workpiece processing apparatus that includes a plasma generator, a plasma chamber and an extraction plate, where charged ions are extracted through a first aperture at a first selected extraction angle, and reactive neutrals are passed through a second aperture at a second selected extraction angle, where the second aperture is different than the first aperture. As described above, the number of charged ions exiting through the neutral species channel may be reduced by the use of a suppressor in conjunction with the neutral species channel.

Figure 4C:
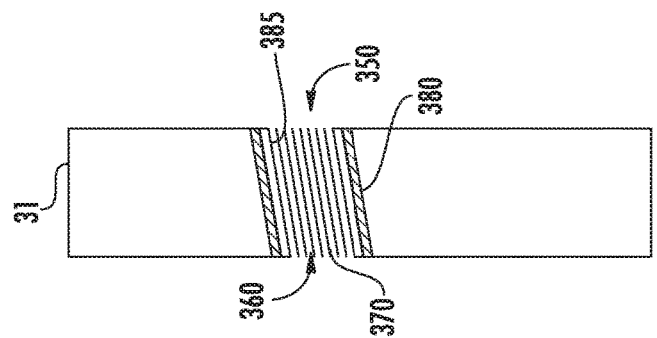
FIGS. 4A-4C shows embodiments of a neutral species channel having collimating channels.
Figure 4B:
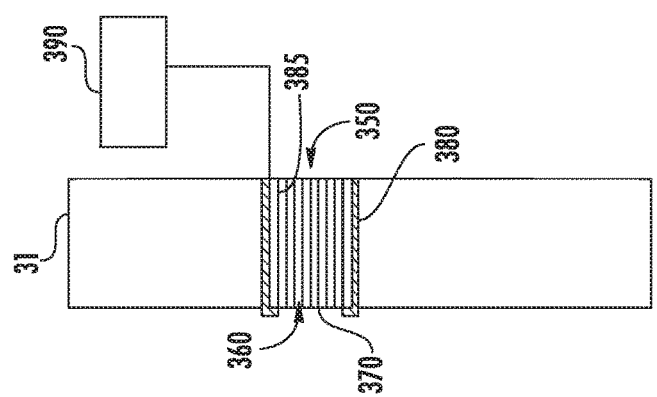
Figure 4A:
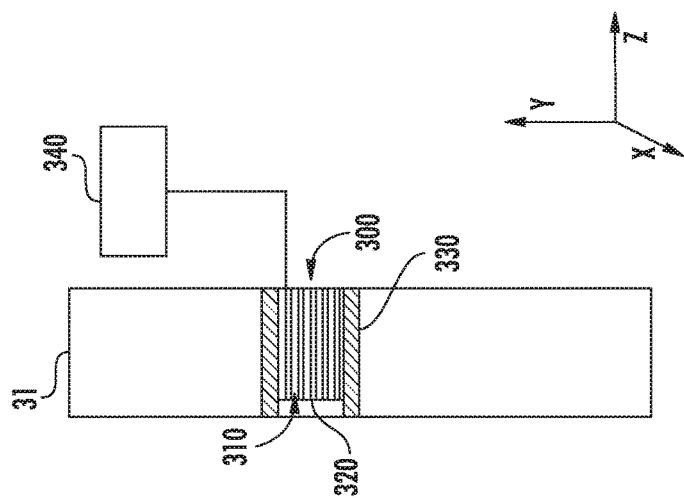

In certain embodiments, it may be beneficial to create a narrower distribution of reactive neutrals. This may be achieved through collimation. FIGS. 4A-4C show embodiments of a neutral species channel having a plurality of collimating columns. FIG. 4A shows a first embodiment of a neutral species channel 300 that includes a plurality of collimating columns 310. As before, the neutral species channel 300 may be surrounded by an insulating material 330 to insulate it from the extraction plate 31. These collimating columns 310 may be created by forming the neutral species channel 300 as an array or raster of many smaller channels. Each of these smaller channels has a higher aspect ratio, since the thickness of each smaller channel in the z-direction is unchanged, while the height in the y-direction is reduced. In one embodiment, these collimating columns 310 may be created by having the electrically biased grid 320 extend through the thickness of the neutral species channel 300. This electrically biased grid 320 may be biased using grid power supply 340. In certain embodiments, the collimating columns 310 are created such that only the y-direction of the neutral species channels 300 is affected. In other embodiments, the collimating columns 310 are created such that both the x-direction and the y-direction of the neutral species channels 300 are affected.

FIG. 4B shows a second embodiment of a neutral species channel 350 having a plurality of collimating columns 360. As before, the neutral species channel 350 may be surrounded by an insulating material 380 to insulate it from the extraction plate 31. In this embodiment, the collimating columns 360 are created by inserting a plurality of thin slats 370 in the neutral species channel 300. These thin slats 370 may be conductive material or insulating material. A conductive cup 385 may be disposed against the inner wall of the insulating material 380, and may be in communication with a cup power supply 390. In certain embodiments, the collimating columns 360 are created such that only the y-direction of the neutral species channels 350 is affected. In other embodiments, the collimating columns 360 are created such that both the x-direction and the y-direction of the neutral species channels 350 are affected.

Further, although FIGS. 4A-B shows the neutral species channels and collimating columns as being orthogonal to the plane of the extraction plate 31, the disclosure is not limited to this embodiment. The neutral species channel and collimating channels may be tilted relative to the plane orthogonal to the extraction plate 31 if desired. For example, FIG. 4C shows the neutral species channel 350 of FIG. 4B tilted slightly upward. The cup power supply 390 is not shown for clarity, however may be used to bias the conductive cup 385. Further, the neutral species channel 350 of FIG. 4B may also be tilted downward if desired. The angle of the tilt is not limited by this disclosure.

Figure 5A:
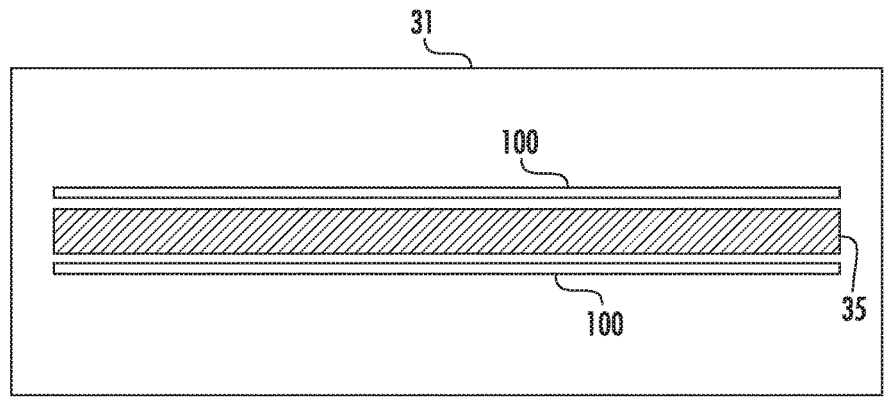
FIGS. 5A-5C shows various embodiments of the neutral species channels as viewed from the workpiece.
Figure 5B:
Figure 5B:
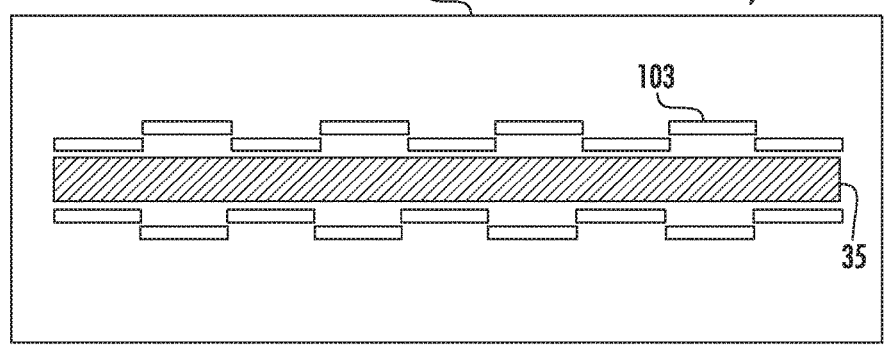
Figure 5C:
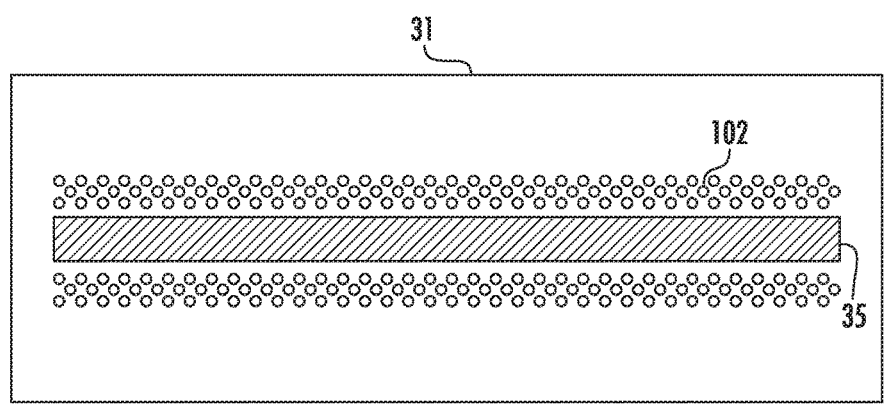

FIGS. 5A-5C shows various embodiments of the extraction plate as seen from the workpiece 90. FIG. 5A shows the extraction plate 31 with an extraction aperture 35 and two neutral species channels 100. One neutral species channel 100 is disposed on each side of the extraction aperture 35. The neutral species channels 100 are each rectangular in shape. The neutral species channels 100 may be the same dimension as the extraction aperture 35 in the x-direction. In certain embodiments, the neutral species channels 100 may be smaller than the extraction aperture 35 in the y-direction.

The neutral species channels 100 may be about 10 mm away from the extraction aperture 35 in the y-direction in certain embodiments.

FIG. 5B shows a second embodiment of the extraction plate as seen from the workpiece 90. In this embodiment, the neutral species channels 103 are staggered and are disposed on either side of the extraction aperture 35. This configuration allows more mechanical strength to remain in the extraction plate 31 but still delivers a sufficient flux of reactive neutrals to the workpiece and accommodates all of the directional and collimating features discussed above.

FIG. 5C shows a third embodiment of the extraction plate 31 as seen from the workpiece 90. In this embodiment, the neutral species channels 102 are circular so as to form collimating columns, as described with respect to FIGS. 4A-4C. The neutral species channels 102 are disposed on either side of the extraction aperture 35. This configuration allows more mechanical strength to remain in the extraction plate but still delivers a sufficient flux of reactive neutrals to the workpiece and accommodates all of the directional and collimating features discussed above.

In certain embodiments, the neutral species channels in FIGS. 5A-5C may each be tilted toward the extraction aperture 35. In other words, the reactive neutrals are directed toward the extraction aperture 35, as shown in FIG. 2. Thus, reactive neutrals are extracted through some neutral species channels at an angle of $+\theta_2$ and extracted through other neutral species channels at an angle of $-\theta_2$, where $\theta_2$ is the second selected extraction angle.

In certain embodiments, it may be desirable to be able to vary the selected extraction angles. The first selected extraction angle may be modified, for example, by varying the electrical fields within the plasma chamber 40 or moving the blocker 37 relative to the extraction aperture 35.

Figure 6A:
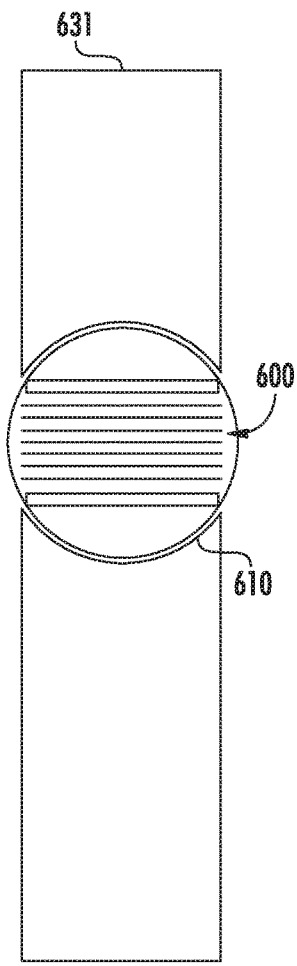
FIGS. 6A-6B show an embodiment with adjustable neutral species channels.
Figure 6B:
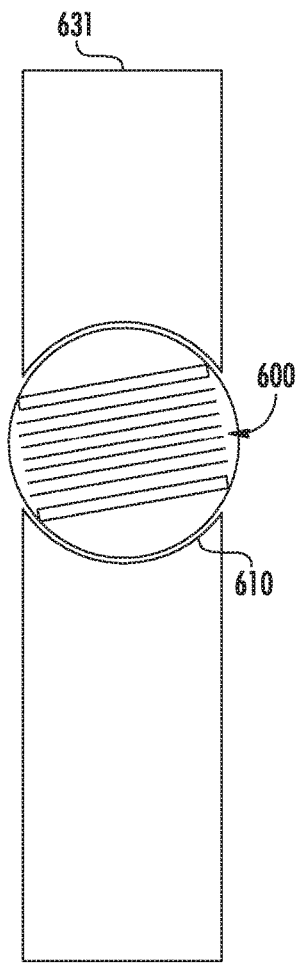

FIGS. 6A-6B shows one embodiment that may be used to modify the second selected extraction angle. In this embodiment, the neutral species channels 600 are housed within a rotatable member 610. The rotatable member 610 may be disposed in the extraction plate 631. The rotatable member 610 may be a suitable material, such as $SiO_2$, SiC, SiN, $Al_2O_3$, and others. A suppressor, which may be an electrically biased grid, a sieve or an electric cup, may also be disposed within the rotatable member 610. FIG. 6A shows the rotatable member 610 positioned so that the neutral species channels 600 are perpendicular to the plane of the extraction plate 631. FIG. 6B shows the rotatable member 610 rotated upward relative to the position in FIG. 6A.

While the disclosure describes the use of a separate neutral species channel, other embodiments are also possible. For example, the blocker and extraction aperture may be designed to achieve the desired extraction angle for the reactive neutrals. FIGS. 8A-8I show a plurality of configurations. In these configurations, the width of the extraction aperture 835 in the extraction plate 831 and the distance between the blocker 837 and the extraction aperture 835 is varied. In these configurations, the width of the extraction aperture 835 and the width of the blocker 837 are related. As the width of the extraction aperture 835 becomes narrower, the width of the blocker 837 is also reduced. The configurations are presented such that the distance between the blocker 837 and the extraction aperture 835 increases moving to the right. The width of the extraction aperture 835 decreases moving downward.

In FIG. 8A, the average extraction angle for a fixed point in the plasma source was found to be 50.8°, with a distribution of extraction angles from 43.3° to 58.2°. Thus, the spread is about 14.9°.

Moving to FIG. 8B, the distance between the blocker 837 and the extraction aperture is increased. This reduces the average extraction angle to 49°, with a distribution of extraction angles from 35.7° to 62.2°. Thus, the spread is about 26.5°.

In FIG. 8C, the distance between the blocker 837 and the extraction aperture is again increased. This reduces the average extraction angle to 41.2°, with a distribution of extraction angles from 24.9° to 57.5°. Thus, the spread is about 32.6°.

Thus, in general, as the distance between the blocker 837 and the extraction aperture 835 is increased, the average extraction angle decreases, but the angular spread increases.

In the configuration shown in FIG. 8D, the distance between the blocker 837 and the extraction aperture 835 is the same as in FIG. 8A, however, the width of the extraction aperture 835 and the blocker 837 is reduced. This results in an average extraction angle to 45.3°, with a distribution of extraction angles from 35.5° to 55.1°. Thus, the spread is about 19.6°.

Moving down to FIG. 8G, the width of the extraction aperture 835 and the blocker 837 is again reduced relative to FIG. 8D. This results in an average extraction angle to 32.7°, with a distribution of extraction angles from 30.1° to 35.3°. Thus, the spread is about 5.2°.

Thus, in general, as the width of the extraction aperture 835 is decreased, the average extraction angle decreases, and the angular spread decreases.

Thus, manipulation of the width of the extraction aperture 835 and the distance between the blocker 837 and the extraction aperture 835 offers another mechanism to control the extraction angle of reactive neutrals. As with the separate neutral species channels, this embodiment relies on the physical configuration of the aperture, since the extraction angle of reactive neutrals is largely dictated by line-of-sight optics. In other words, reactive neutrals typically travel along paths in which there is a clear path from the plasma chamber to the exterior of the extraction plate 831. Thus, by manipulating the width of the extraction aperture 835 and the distance between the blocker 837 and the extraction aperture 835, the extraction angle of reactive neutrals can be controlled.

Further, modifying the width of the blocker 837 independently from the width of the extraction aperture 835 may offer another mechanism to control the extraction angles of reactive neutrals.

In FIGS. 8A-8I, as was described above, the extraction angle of charged ions is determined by the shape of the plasma sheath and electric fields in proximity to the extraction aperture 835. Thus, the extraction angle of the charged ions and the extraction angle of reactive neutrals are controlled using two different mechanisms.

In another embodiment, the blocker 837 and extraction aperture 835, shown in FIGS. 8A-8I may be used for the extraction of neutral species only. In this embodiment, the blocker 837 may be biased with a positive electrical potential in order to repel positive ions generated in the plasma. Further, in this embodiment, the extraction aperture 835 may be similar to the neutral species channels shown in FIG. 2. Thus, the extraction aperture 835 serves as the pathway for neutral species to exit in a second selected extraction angle. In this embodiment, the blocker 37 and extraction aperture 35 shown in FIG. 1 may also be employed. In other words, two blockers may be disposed within the plasma chamber 30. The blocker 37 serves to manipulate the plasma sheath to facilitate the extraction of charged ions through the extraction aperture 35 at a first selected extraction angle. The blocker 837 serves to provide a pathway for reactive neutrals through extraction aperture 835 so that these neutrals are extracted at a second selected extraction angle. Further, since the blocker 837 and extraction aperture 835 allow a bimodal extraction of reactive neutrals, in some embodiments, only one neutral species channel is used.

Figure 9:
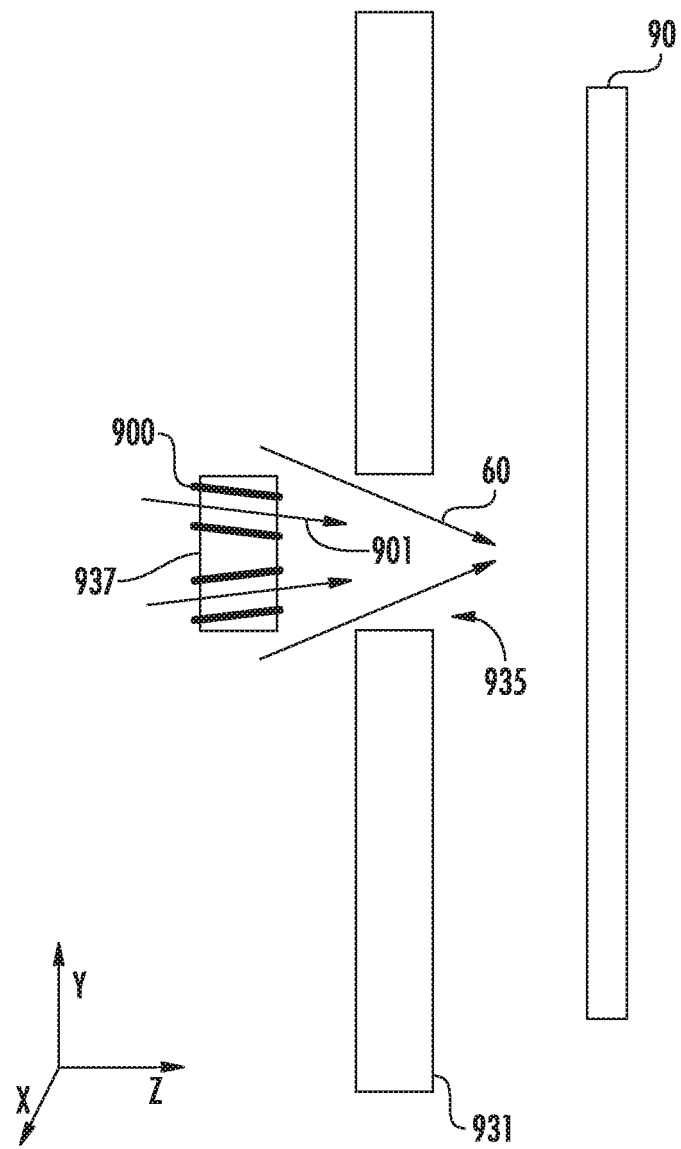
FIG. 9 is an expanded view of the extraction plate and blocker of the workpiece processing apparatus according to another embodiment.

FIGS. 1, 2 and 5A-C illustrate the use of neutral species channels 100 disposed in the extraction plate 31. These neutral species channels 100 serve to guide the reactive neutrals in a desired path. However, the neutral species channels may also be disposed in other locations. FIG. 9 shows an extraction plate 931 and a blocker 937. As was shown in FIG. 2, charged ions exit as a ribbon ion beam 60 through the extraction aperture 935. However, in this embodiment, the neutral species channels 900 are disposed in the blocker 937. Like the previous embodiments, the geometric configuration of the neutral species channels 900 serves to determine the extraction angle of reactive neutrals 901 from the extraction aperture 935. Further, as was described above, the neutral species channels 900 in the blocker 937 may also include a suppressor, such as any of those shown in FIGS. 3A-3C. In addition, the neutral species channels 900 disposed in the blocker 937 may also be collimated, as shown in the embodiments of FIGS. 4A-4C.

Figure 10:
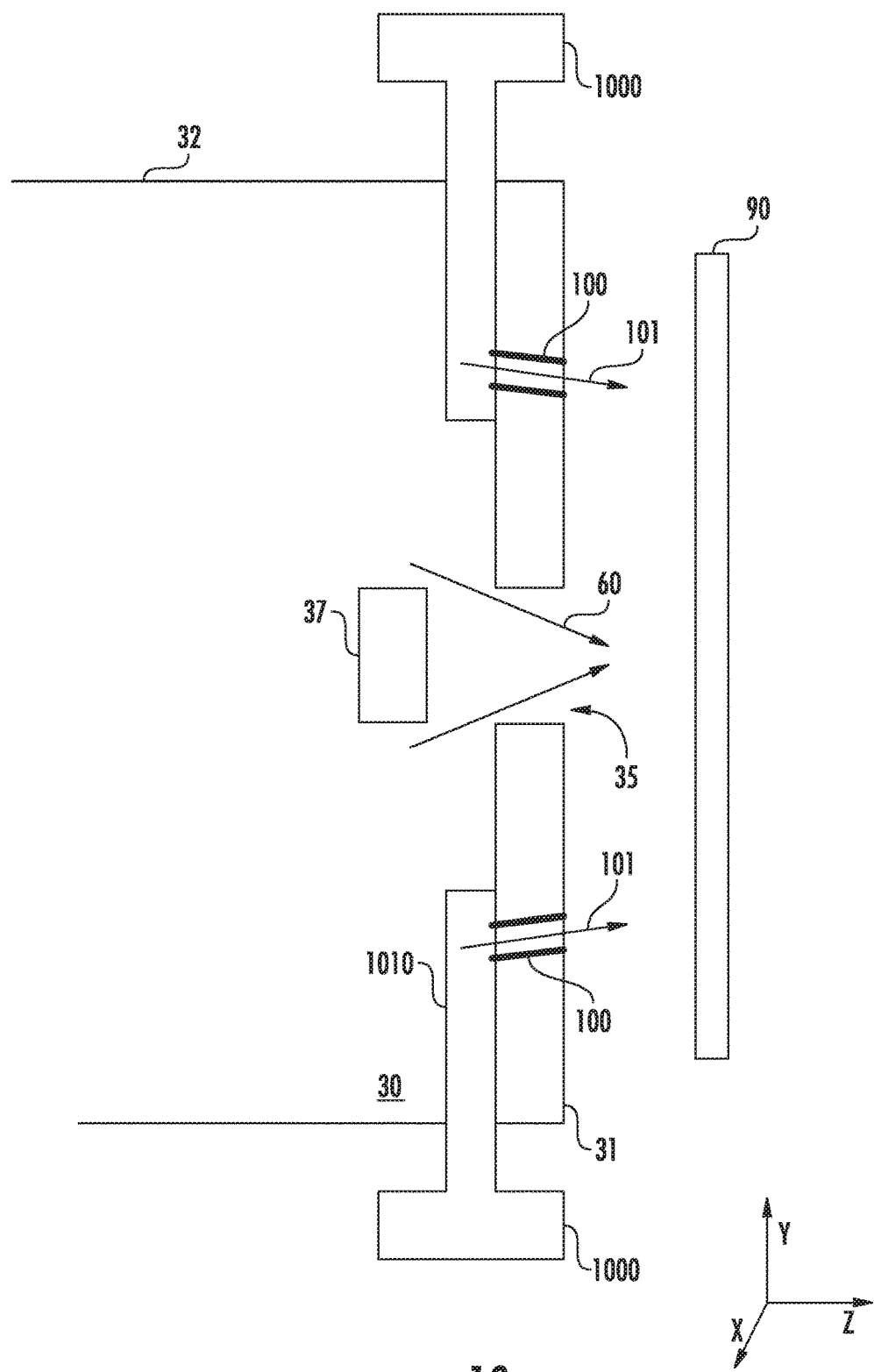
FIG. 10 is an expanded view of the extraction plate of the workpiece processing apparatus according to another embodiment.

The above disclosure and figures describe embodiments in which the reactive neutrals are extracted from the same plasma chamber which produces the charged ions. However, other embodiments are also possible. For example, FIG. 10 shows another embodiment. In this embodiment, the neutral species channels 100 are in communication with neutral species pathways 1010. These neutral species pathways 1010 may be in communication with one or more remote neutral species generators 1000. In certain embodiments, the remote neutral species generator 1000 may be a plasma generator or other suitable device. The reactive neutrals are then transported along the neutral species pathways 1010 to the neutral species channels 100, where they are directed toward the workpiece 90. In other words, the neutral species channels in FIG. 10 are separated from the plasma chamber 30. This embodiment may be beneficial in embodiments where long-lived or metastable reactive neutral species are used. For example, fluorine atoms may be delivered to the neutral species channels 100 using this mechanism. Further, although FIG. 10 is shown as a modification of FIG. 2, it is understand that the remote neutral species generator 1000 may be employed with any of the configurations shown in the other figures.

Figure 7A:
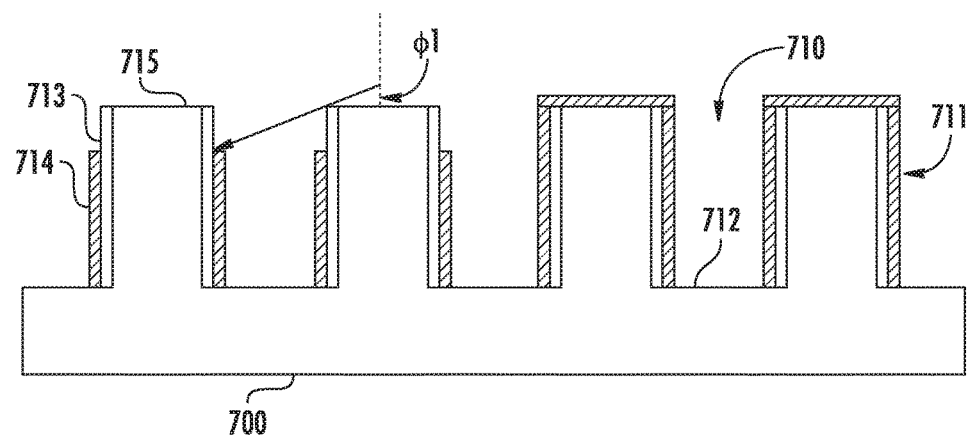
FIGS. 7A-7B shows representative workpieces that may be processed using the apparatus of FIG. 1.

The disclosed apparatus has many possible applications. In one particular application, the apparatus is used to perform directed reactive ion etching (DRIE). In this application, both charged ions and reactive neutrals are delivered toward the workpiece at selected extraction angles. These selected extraction angles allow for the etching of material, particularly material disposed in a trench. FIG. 7A shows a workpiece 700 to be etched. The workpiece 700 has a plurality of trenches 710, each trench having sidewalls 711 and a bottom 712. The workpiece may be any suitable material, including, but not limited to, crystalline silicon, amorphous silicon, polysilicon and silicon dioxide. The sidewalls 711 of each trench 710 may be coated with one or more films which may be a dielectric 713, such as silicon dioxide, silicon nitride, hafnium dioxide and others. The surface of the workpiece 700 is also conformally covered by a liner 714, such as, for example, cobalt, tungsten, aluminum, copper or titanium nitride. In certain embodiments, it may be beneficial to remove the liner 714 on the top surface and to a specific depth on the sidewalls 711.

In some embodiments, the removal of the liner 714 is achieved by striking the workpiece 700 with both charged ions and reactive neutrals. In certain embodiments, the charged ions and reactive neutrals may be created using a halogen-based feedgas, such as, for example, $Cl_2$, $CF_4$, $CHF_3$, $CH_3F$, $C_2F_6$, $Br_2$, $BBr_3$, HBr or $I_2$. In other embodiments, the charged ions and reactive neutrals may be created using a feedgas that comprises $O_2$, $H_2$, or $NH_3$. In operation, a feedgas, which may be one or more of the species recited above, is introduced into the plasma chamber 30. RF power is applied to the antenna 20 by the RF power supply 27. A plasma is created, that includes charged ions, such as $Cl^+$, as well as reactive neutrals, such as Cl.

In one non-limiting example, each trench 710 may be 100 nm deep and only the top 20 nm of the liner 714 is to be removed. Additionally, the liner 714 is to be removed from the top surface 715. To remove a portion of the liner 714 from the sidewalls 711, the charged ions and reactive neutrals strike the workpiece 700 at an angle $\phi_1$, as shown in FIG. 7A. If the angle at which these ions and reactive neutrals strike the workpiece is greater than $\phi_1$, the liner 714 on the sidewalls 711 will not be etched to the proper level. A greater angle (i.e. more horizontal) will etch less of the sidewalls 711 as the top surface 715 of an adjacent trench will block the ions and reactive neutrals from striking the sidewall 711.

Figure 7B:
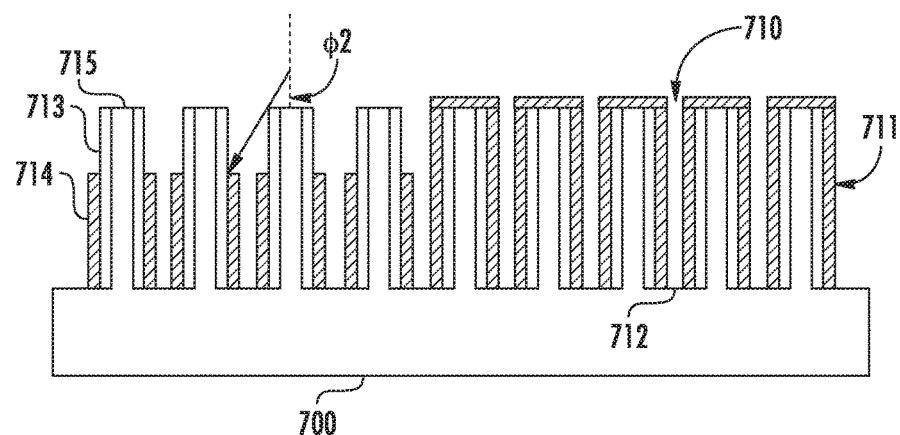

FIGS. 7A-7B show the workpiece 700 during processing. In these figures, the workpiece 700 is moving to the left relative to the workpiece processing apparatus 10. Consequently, trenches 710 on the left side of the figures have been etched, while trenches 710 on the right side are still covered by the liner 714.

FIG. 7A shows an angle, $\phi_1$, that is used to etch the proper amount of liner 714 from the sidewalls 711. This angle is a function of the pitch (i.e. the distance between adjacent trenches), the aspect ratio of the trenches, and the amount of liner 714 to be removed. The angle, $\phi_1$, used in FIG. 7A is relatively large. FIG. 7B shows a workpiece 700 having trenches 710 which are positioned much closer together than those in FIG. 7A. Consequently, the angle, $\phi_2$, that is used to etch the proper amount of liner 714 from the sidewalls 711 is much smaller than $\phi_1$. The apparatus disclosed herein is able to create this desired angle for reactive neutrals through the use of the neutral species channels.

The embodiments described above in the present application may have many advantages. First, directed reactive ion etching may be more effective and efficient when both charged ions and reactive neutrals contact the surface to the charged. The extraction angle of reactive neutrals may be precisely controlled through the use of neutral species channels in a manner that may not be possible using conventional techniques. This precise extraction angle control allows etching of densely packed features. In fact, in certain embodiments, the time to etch the sidewall of a trench may be reduced by an order of magnitude or more by being able to precisely direct the reactive neutrals to the desired locations.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A workpiece processing apparatus, comprising:
a plasma generator;
a plasma chamber; and
one extraction plate having a first aperture and a second aperture;
wherein charged ions are extracted through the first aperture at a first selected extraction angle, and reactive neutrals are passed through the second aperture at a second selected extraction angle, where the second aperture is different than the first aperture and comprises a suppressor to minimize charged ions passing through the second aperture by repelling or neutralizing the charged ions.

2. The workpiece processing apparatus of claim 1, wherein the suppressor comprises an electrically biased conductive grid disposed in the second aperture to repel the charged ions.

3. The workpiece processing apparatus of claim 1, wherein the suppressor comprises an electrically biased cup disposed around the second aperture to repel the charged ions.

4. The workpiece processing apparatus of claim 1, wherein the suppressor comprises a sieve to neutralize charged ions entering the second aperture before exiting the second aperture.

5. The workpiece processing apparatus of claim 1, wherein the second selected extraction angle is determined by a tilt of the second aperture relative to a plane orthogonal to the extraction plate.

6. The workpiece processing apparatus of claim 1, wherein an angular distribution of reactive neutrals about the second selected extraction angle is determined by an aspect ratio of the second aperture, defined as a length of the second aperture through the extraction plate divided by a height of the second aperture.

7. The workpiece processing apparatus of claim 1, wherein a blocker is disposed in the plasma chamber and wherein the second selected extraction angle and an angular distribution of reactive neutrals about the second selected extraction angle is determined by a width of the second aperture, a width of the blocker and a distance between the blocker and the second aperture.

8. A workpiece processing apparatus, comprising:
a plasma generator;
a plasma chamber;
one extraction plate comprising an extraction aperture; and
a blocker disposed within the plasma chamber proximate the extraction aperture;
wherein the workpiece processing apparatus uses plasma sheath modulation or electric fields to extract charged ions through the extraction aperture as an ion beam at a first selected extraction angle;
wherein reactive neutrals are passed through a neutral species channel at a second selected extraction angle, and wherein passage of charged ions through the neutral species channel is minimized; and
wherein the neutral species channel is disposed in the blocker, such that reactive neutrals pass through the neutral species channel in the blocker before exiting the plasma chamber.

9. The workpiece processing apparatus of claim 8, wherein the second aperture comprises a suppressor to minimize charged ions passing through the second aperture.

10. The workpiece processing apparatus of claim 9, wherein the suppressor comprises an electrically biased conductive grid disposed in the second aperture to repel the charged ions.

11. The workpiece processing apparatus of claim 9, wherein the suppressor comprises an electrically biased cup disposed around the second aperture to repel the charged ions.

12. The workpiece processing apparatus of claim 9, wherein the suppressor comprises a sieve to neutralize charged ions entering the second aperture before exiting the second aperture.

13. A workpiece processing apparatus, comprising:
a plasma generator;
a plasma chamber;
one extraction plate comprising an extraction aperture having a width much greater than its height, and neutral species channels disposed on opposite sides of the extraction aperture in a height direction;
wherein charged ions exit the plasma chamber through the extraction aperture as an ion beam at a first extraction angle;
wherein reactive neutrals are passed through the neutral species channels at a second selected extraction angle; and
wherein passage of charged ions through the neutral species channel is minimized.

14. The workpiece processing apparatus of claim 13, wherein an insulating blocker is disposed within the plasma chamber proximate the extraction aperture and wherein the size and position of the blocker relative to the extraction aperture define the first extraction angle.

15. The workpiece processing apparatus of claim 13, wherein the charged ions are minimized by neutralizing the charged ions after the charged ions enter the neutral species channel and before exiting.

16. The workpiece processing apparatus of claim 13, wherein the charged ions are repelled away from the neutral species channels.

17. The workpiece processing apparatus of claim 13, wherein the neutral species channels are housed within rotatable members to modify the second extraction angle.

18. The workpiece processing apparatus of claim 13, wherein the neutral species channels comprise collimating columns to narrow an angular distribution of reactive neutrals exiting the plasma chamber.

19. The workpiece processing apparatus of claim 13, wherein the reactive neutrals are created in a remote neutral species generator, different from the plasma chamber, and are transported to the second aperture via neutral species pathways, separated from the plasma chamber.

* * * * *